United States Patent [19]

Omoto

[11] Patent Number: 4,955,074
[45] Date of Patent: Sep. 4, 1990

[54] AFC APPARATUS WITH SELECTION BETWEEN AVERAGE VALUE MODE AND KEYED MODE

[75] Inventor: Noriaki Omoto, Takatsuki, Japan

[73] Assignee: Matsushita Electric Industrial Co., Ltd., Osaka, Japan

[21] Appl. No.: 356,237

[22] Filed: May 24, 1989

[30] Foreign Application Priority Data

May 30, 1988 [JP] Japan ................................. 63-131854
Dec. 6, 1988 [JP] Japan ................................. 63-307992

[51] Int. Cl.⁵ ............................................. H04B 11/16
[52] U.S. Cl. ................................... 455/182; 455/183; 455/192; 455/260
[58] Field of Search ............... 455/265, 257, 260, 263, 455/264, 182, 183, 192; 358/195.1

[56] References Cited

U.S. PATENT DOCUMENTS

| | | | |
|---|---|---|---|
| 3,934,205 | 1/1976 | Bogert | 455/260 |
| 4,099,125 | 7/1978 | Bennett, Jr. et al. | 455/265 |
| 4,291,332 | 9/1981 | Kato et al. | 358/19 |
| 4,438,528 | 3/1984 | Itagaki | 455/182 |
| 4,476,584 | 10/1984 | Dages | 455/182 |
| 4,625,331 | 11/1986 | Richardson et al. | 455/260 |
| 4,630,118 | 12/1986 | Suzuki | 455/192 |
| 4,658,438 | 4/1987 | Kamata et al. | 455/192 |
| 4,670,776 | 6/1987 | Matsumoto | 358/40 |
| 4,715,001 | 12/1987 | Deem et al. | 455/182 |

FOREIGN PATENT DOCUMENTS 55-23674 2/1980 Japan ................................. 455/192
59-28297 7/1984 Japan.

*Primary Examiner*—Reinhard J. Eisenzopf
*Assistant Examiner*—Andrew Faile
*Attorney, Agent, or Firm*—Stevens, Davis, Miller & Mosher

[57] ABSTRACT

An AFC apparatus effectively used for a satellite broadcasting receiver and making up a tuning circuit of frequency synthesizer system using a phase-locked loop (PLL) is disclosed, in which a frequency error detector for detecting an error of an output signal of a demodulator from the central frequency comprises first and second comparators supplied with an output of the demodulator and reference voltages, a first latch circuit for latching an output of the first comparator by a key pulse, and a second latch circuit for latching an output of the second compartor by a key pulse. A demodulation output is thus accurately held to realize an accurate data comparison even against a key pulse of a large duty factor.

2 Claims, 5 Drawing Sheets

FIG. 3 PRIOR ART
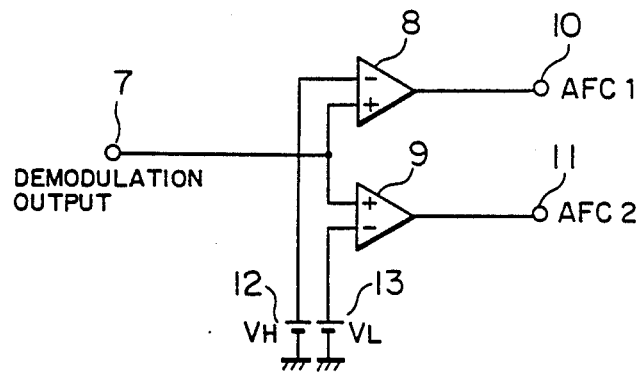
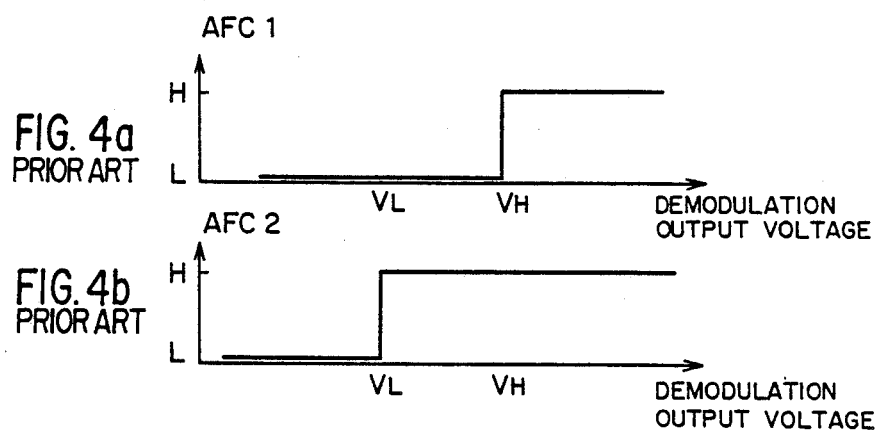
FIG. 4a PRIOR ART
FIG. 4b PRIOR ART

AFC APPARATUS WITH SELECTION BETWEEN AVERAGE VALUE MODE AND KEYED MODE

BACKGROUND OF THE INVENTION

The present invention relates to an AFC (automatic frequency control) apparatus for a satellite broadcasting receiver or the like.

In recent years, a tuning circuit of the frequency synthesizer type using a phase synchronization loop has come to be employed generally for a satellite broadcasting receiver or the like. The use of a frequency synthesizer system stabilizes the local oscillation frequency of a tuning circuit of 1 GHz band with high accuracy. In the case of a satellite broadcasting receiver, however, the local oscillator used for converting a signal of 12 GHz band received by BS antenna into a signal of 1 GHz band in frequency has a frequency drift of about 2 MHz, and therefore an AFC apparatus is indispensable. The satellite broadcasting receivers used in Japan employ an average-value AFC system, in which an average DC voltage of a video signal providing a modulation signal is controlled to a central frequency for modulation.

On the other hand, a high-definition television (Hi-Vision) broadcasting by use of a satellite is planned, and the introduction of the keyed AFC system is considered in Japan as a receiver for such a high-definition television broadcasting.

A satellite broadcasting receiver of the keyed AFC type will be described with reference to the drawings. This receiver is generally configured as shown in FIG. 1. In FIG. 1, reference numeral 1 designates an FM signal input terminal, numeral 2 a mixer for frequency conversion, numeral 3 an FM demodulator, numeral 4 a frequency error detector, numeral 5 a PLL frequency control circuit, and numeral 6 a local oscillator. An example of a general configuration of a satellite broadcasting receiver shown in FIG. 1 also includes an AGC (automatic gain control) circuit and the like which are not related to the function of automatic frequency control and therefore are not shown.

An FM signal of 12 GHz band applied to the input terminal 1 is converted into a signal of intermediate frequency of 1 GHz band by a frequency mixer 2 and applied to the FM demodulator 3. The input signal is FM demodulated by the FM demodulator 3 and reproduced therefrom. The demodulation characteristic of the FM demodulator 3 is generally as shown in FIG. 2. FIG. 2 indicates that with the increase in FM signal frequency, the potential of the demodulation output is increased, so that a frequency change is produced as a voltage change.

The function of the frequency error detector 4 is to decide whether the error of the intermediate frequency from the central frequency (fO) is larger than a predetermined value and whether the frequency error is upward or downward of frequency. In FIG. 2, assuming allowable values of frequency error are (±) Δf, the output voltage of the FM demodulator 3 may be considered as $V_H$ or $V_L$ at the critical allowable value of frequency error.

In view of this, a construction of the frequency error detector 4 as shown in FIG. 3 is considered. Numerals 8 and 9 designate voltage comparator ICs, and numerals 12 and 13 reference voltage sources. As shown in FIG. 3, if the reference potentials are selected at $V_H$ and $V_L$, the voltage comparator ICs 8 and 9 are turned on at the demodulation output voltages of $V_H$ and $V_L$ respectively, and therefore the outputs AFC1 and AFC2 of the frequency error detector 4 have input-output characteristics as shown in FIG. 4. FIG. 4 shows that if intermediate frequency becomes lower than the central frequency ($f_o$) by more than a predetermined frequency error (Δf), both AFC1 and FAC2 are at low level, and vice versa.

If the oscillation frequency of the local oscillator 6 is controlled by applying these outputs of the frequency error detector 4 to the PLL frequency control circuit 5 in FIG. 1, the intermediate frequency is always controlled within a predetermined frequency error, thereby attaining an AFC function.

A frequency error of about 300 kHz is generally selected for a satellite broadcasting receiver, and if the frequency accuracy of the AFC is to be maintained at a satisfactory level, it is necessary to reduce the temperature drift or the like of the demodulation output of the demodulator to a smaller value.

In the keyed AFC system for the high-definition television broadcasting, a key pulse having a pulse duration as shown in FIG. 5 is produced during the flyback period of a demodulation signal, and while the pulse is produced, the potential of the demodulation signal is kept constant, thus fixing the frequency of the demodulated FM signal. In view of the fact that a frequency corresponding to the potential of a modulation signal during the keyed pulse duration is controlled to a central frequency, the extension of the occupied bandwidth of a demodulation spectrum realized with the change in APL of the video signal is narrow as compared with that for the average value AFC system. As a result, for the purpose of the satellite broadcasting with a fixed transmission bandwidth (DBS), the keyed AFC system is capable of transmitting with a wider degree of modulation.

A configuration as shown in FIG. 6 has thus been generally employed conventionally for the frequency error detector 4 of a keyed AFC apparatus for the satellite broadcasting receiver. In FIG. 6, component parts designated by numerals 7 to 13 have the same configuration as those of corresponding numerals in FIG. 3, in which a demodulation signal is applied to voltage comparator ICs 8 and 9 through a sample hold circuit 17 including an analog switch 15 and a holding capacitor 16. The sample hold circuit 17 applies a key pulse shown in FIG. 5 to a key pulse input terminal 14, and when this pulse is low in level, the analog switch 17 is closed thereby to charge the holding capacitor 16 up to a voltage level of the demodulation output, while the analog switch 15 is opened when the key pulse reaches a high level, thus holding the voltage level of the demodulation output. By comparing this voltage level with reference potentials $V_H$ and $V_L$ at the voltage comparator ICs 8 and 9, frequency error detection outputs AFC1 and AFC2 are produced.

In view of the duty factor of the key pulse as large as about 100 for the high definition television broadcasting system, however, the above-mentioned configuration would cause a change in the level of the demodulated voltage held by the leakage current of the analog switch or voltage comparator IC, thus making accurate comparison by demodulation output values. As a result, the frequency accuracy of frequency error detection is problematically low.

SUMMARY OF THE INVENTION

In view of the above-mentioned problem, the object of the present invention is to provide a high-precision AFC apparatus realizing a frequency error detector capable of detecting a frequency error with high frequency accuracy.

In order to achieve the above-mentioned object, there is provided according to one aspect of the present invention an AFC apparatus comprising a first comparator supplied with an output of an FM demodulator and a first reference voltage, a second comparator supplied with an output of the FM demodulator and a second reference voltage, a first latch circuit for holding the output of the first comparator in response to a key pulse, and a second latch circuit for holding the output of the second comparator in response to a key pulse.

In the aforementioned configuration of the invention, the first comparator compares an output of an FM demodulator with the first reference voltage equal to the output voltage of the FM demodulator with an intermediate frequency deviated upward by a predetermined frequency error, and if the intermediate frequency deviates upward from the central frequency by more than the predetermined frequency error, a high-level output is produced. Further, a second comparator compares an output of the FM demodulator with a second reference voltage with the intermediate frequency deviated downward from frequency the central frequency by more than a predetermined frequency error, so that if the intermediate frequency deviates from the central frequency by more than the predetermined frequency error, a low-level output is produced.

The outputs of the comparators are applied to data input terminals of the first and second latch circuits respectively, and the latch circuits fetch and hold input data in response to a key pulse. In this way, the frequency error detection data for AFC is updated for each key pulse, thereby making up a keyed AFC apparatus for controlling the intermediate frequency within a predetermined frequency error during the period of a key pulse.

According to a frequency error detector of the present invention, data on a frequency error during a key pulse period is converted into a digital logic value, and the sample-holding function is performed by latching the data, thus totally eliminating an accuracy deterioration in frequency error detection which otherwise might accompany a change in hold potential due to a leakage current of an IC or the like.

According to another aspect of the present invention, there is provided an AFC apparatus comprising a first comparator supplied with a first reference voltage and an output of an FM demodulator through a low-pass filter having a control terminal for switching two types of cut-off frequency, a second comparator supplied with a second reference voltage and an output of an FM demodulator through a low-pass filter, a first latch circuit for holding an output of the first comparator in response to a key pulse, a second latch circuit for holding an output of the second comparator in response to a key pulse, and a decision circuit for deciding on the presence or absence of a key pulse, wherein an output of the decision circuit is connected to the control terminal of the low-pass filter, and when no key pulse is applied, the cut-off frequency of the low-pass filter is reduced, the AC component of the output signal of the FM demodulator is smoothed to collect the DC component thereof and applied to a comparator and the first and second latch circuits are enabled, while when a key pulse is applied, the cut-off frequency of the low-pass filter is increased and is set to have a time constant smaller than during the key pulse period, only a noise component of an output signal of an FM demodulator is smoothed and applied to a comparator, and the first and second latch circuits are enabled only during the key pulse period. During the period other than the key pulse period, the local oscillation frequency of a frequency synthesizer tuning circuit due to a phase synchronization loop including a voltage-controlled oscillator is finely adjusted by use of output signals of the first and second latch circuits obtained in hold state.

With a configuration mentioned above, the present invention is such that a first comparator compares an output of an FM demodulator with a first reference voltage equal to an FM demodulation output voltage which would be assumed when an intermediate frequency would deviate upward from the central frequency by a predetermined frequency error, and if the intermediate frequency exceeds the central frequency by more than the predetermined frequency error, a high-level output is produced. Further, a second comparator compares an FM demodulation output with a second reference voltage equal to an FM demodulation output voltage which would be assumed when the intermediate frequency deviates downward by more than a predetermined frequency error, and if the intermediate frequency is found to deviate from the central frequency by more than the predetermined frequency error, a low-level output is produced.

In the absence of an applied key pulse, the cut-off frequency of the low-pass filter is reduced and the AC component of an output signal of the FM demodulator is smoothed thereby to collect a DC component thereof. This DC component provides an average value for a video signal that is an FM modulation signal, and therefore an average-value AFC is made possible by comparing this voltage value with a reference voltage. In the absence of an applied key pulse, the latch circuits are enabled with a comparator output produced directly from the latch circuits. If the local oscillation frequency is finely adjusted by a PLL frequency synthesizer circuit by use of this frequency error detection output, the AFC apparatus operates as an average-value AFC type apparatus.

In the presence of an applied key pulse, on the other hand, the cut-off frequency of the low-pass filter is increased and set to a time constant smaller than the key pulse period. As a result, only the noise component contained in the output signal of the FM demodulator is smoothed and applied to the comparators for comparison with the first and second reference voltages. Outputs of the comparators are applied to the latch circuits. During the key pulse period, the latch circuits are enabled and therefore the data applied to the latch circuits are outputted directly. For other than the key pulse period, on the other hand, the latch circuits are held at a condition previously applied. In this way, the frequency error detection data for the AFC is updated for each key pulse, so that if the intermediate frequency for the key pulse period is kept within a predetermined frequency error by fine adjustment of the local oscillation frequency by means of the PLL frequency synthesizer circuit, the AFC apparatus is operated as a keyed AFC apparatus.

According to an AFC apparatus of the present invention, the data on a frequency error during a key pulse period is converted into a digital logic value, and the sample holding function is performed by latching data, thereby totally eliminating an accuracy deterioration of frequency error detection which otherwise might result from a change in hold potential due to a leakage current of the comparator ICs or the like.

BRIEF DESCRIPTION OF THE DRAWINGS

FIG. 3 is a block diagram showing a frequency error detector in a satellite broadcasting receiver according to the prior art.

FIG. 4A and 4B are diagrams showing input-output characteristic of a frequency error detector of a conventional satellite broadcasting receiver.

DESCRIPTION OF THE PREFERRED EMBODIMENTS

Figure 7:
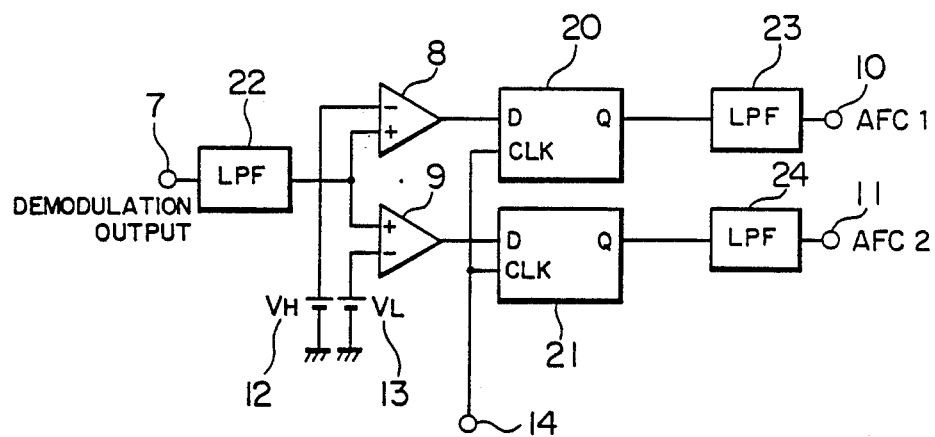
FIG. 7 is a block diagram showing a keyed AFC apparatus of a satellite broadcasting receiver according to a first embodiment of the present invention.

An AFC apparatus for a satellite broadcasting receiver according to a first embodiment of the present invention will be explained with reference to the accompanying drawings. The AFC apparatus according to this embodiment has a feature in a frequency error detector and has a configuration of the remaining components similar to those of the conventional apparatus shown in FIG. 1. FIG. 7 is a block diagram showing an AFC apparatus according to the present embodiment, or in particular a configuration of a frequency error detector.

In FIG. 7, numeral 7 designates an input terminal supplied with an output of an FM demodulator, numerals 8, 9 voltage comparator ICs, numerals 10, 11 output terminals, and numerals 12, 13 reference voltage sources. These component parts are similar to corresponding ones of the conventional AFC apparatus shown in FIG. 3.

An FM demodulation output is applied to the input terminal 7 of the frequency error detection circuit wherein a noise component contained in the demodulation output is removed by a low-pass filter (LPF) 22. The time constant of the LPF 22 is required to be maintained at a value smaller than the duration of a key pulse (such as 17 μs, which is defined by MUSE (multiple sub-Nyquist sampling encoder) system as suggested by Japan Broadcasting Corporation) so that the demodulation signal component may fully respond to the key pulse duration. Thus the LPF 22 is effective only for removing the high frequency noise component of the demodulation output.

Figure 8:
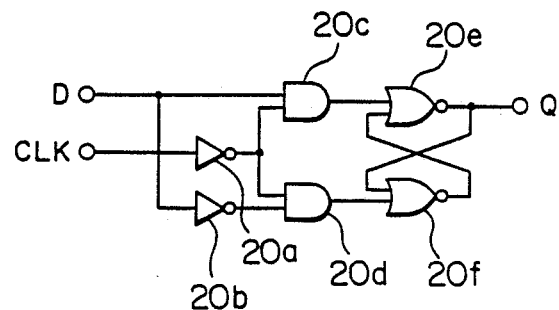
FIG. 8 is a diagram showing a D-latch circuit making up a keyed AFC apparatus according to the first embodiment of the invention.

An output of the LPF 22 is compared with reference voltages 12 ($V_H$) and 13 ($V_L$) corresponding to the critical values of a predetermined frequency error at the voltage comparator ICs 8 and 9. The voltage comparator ICs 8 and 9 are required to respond sufficiently rapidly as compared with the duration of the key pulse or at the rate of approximately 1 to 3 μs. This response rate is realized by a general-purpose comparator IC. The comparator 8 produces an output when the intermediate frequency deviates upward of the central frequency (say, 402.78 kHz) by more than a predetermined frequency error (say, 300 kHz). The comparator 9, on the other hand, produces an output when the intermediate frequency deviates downward of the central frequency by more than a predetermined frequency error. The D-latch circuits 20, 21 are realized by two inverter gates, two AND gates and two NOR gates as shown in FIG. 8. Outputs of the comparators 8 and 9 are applied to the data input terminals of the D-latch circuits 20 and 21 respectively, while a key pulse is applied to a clock input terminal of each D-latch circuit. The logic value of the data input terminals is inputted and held each time of application thereto of a key pulse.

Outputs of the D-latch circuits 20 and 21 are applied to the LPF 23 and LPF 24 respectively. The LPF 23 functions as a noise-removing integration circuit in case a reduced receiving CN ratio increases noise contained in the demodulation output and causes outputs of the comparators 8 and 9 to be produced by error from normal data. For this purpose, the time constant of this LPF is desirably sufficiently large to suit the AFC operation and about 0.3 to one second. In the case of MUSE system, a key pulse is applied every 0.017 seconds, and therefore if the time constant is selected at a value more than about ten times higher than this period, a sufficient noise-removing ability is expected. The outputs AFC1 and AFC2 of the frequency error detectors of the intermediate frequency against the central frequency thus obtained have output characteristics as shown in FIG. 4, and therefore the frequency error detectors according to the present embodiment may be used also for the AFC apparatus of keyed AFC type.

As explained above, according to the present invention, when an intermediate frequency develops a predetermined frequency error, a reference voltage equal to the voltage developed in an FM demodulation output are applied together with the FM demodulation output to a comparator for voltage comparison, and the output of the comparator is applied to a latch and held for each key pulse thereby to detect whether the frequency error of the intermediate frequency is more than a predetermined value and the direction of the frequency deviation with high accuracy, thus contributing greatly to practical effects.

Figure 1:
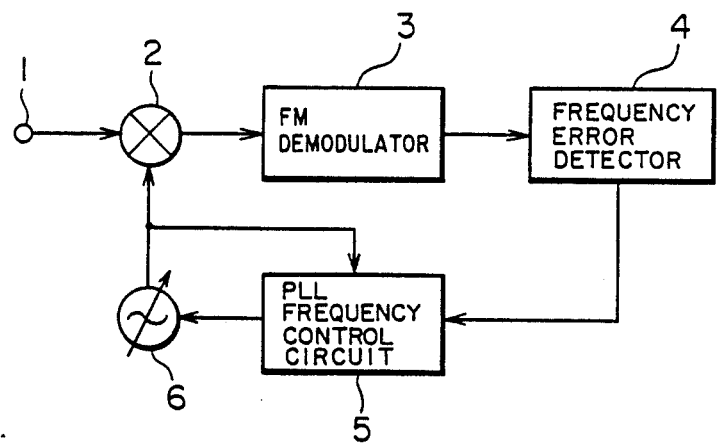
FIG. 1 is a block diagram showing a conventional satellite broadcasting receiver.
Figure 2:
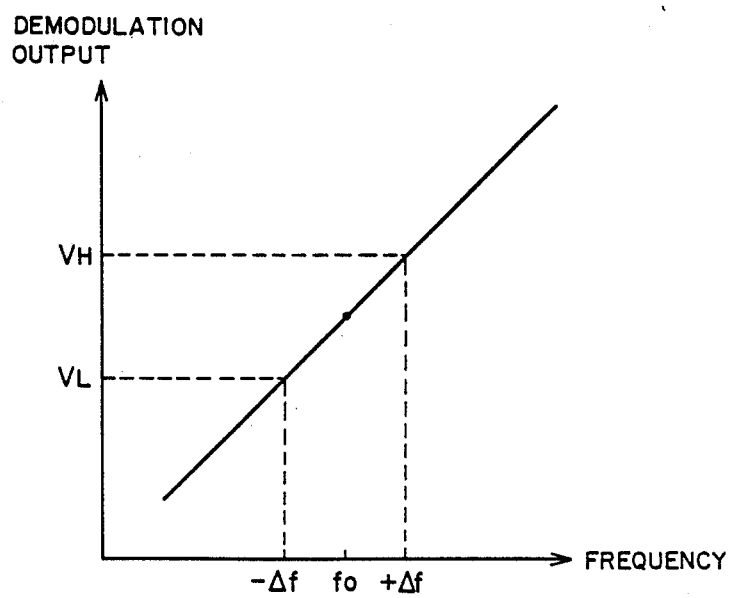
FIG. 2 is characteristics diagram showing the relationship between an input signal frequency and a demodulation output voltage of an FM demodulator of a satellite broadcasting receiver in the prior art.
Figure 9:
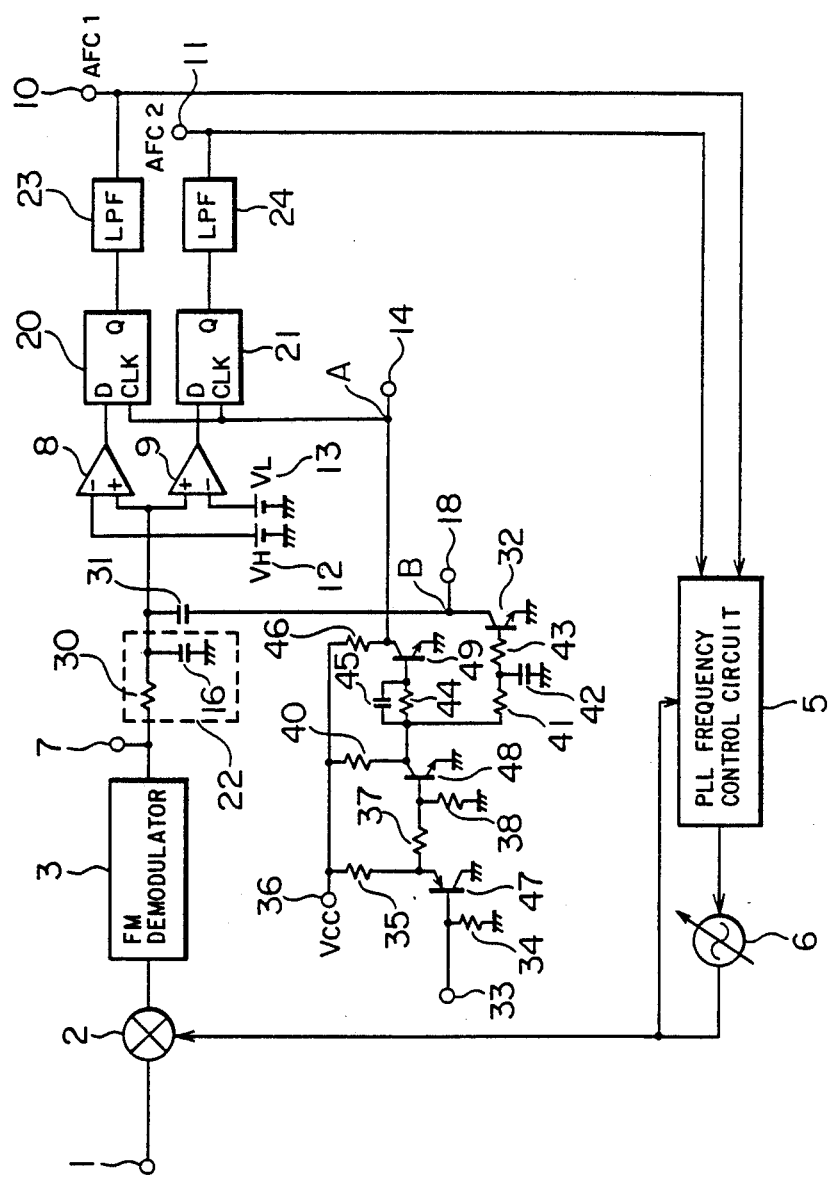
FIG. 9 is a block diagram showing a keyed AFC apparatus of a satellite broadcasting receiver according to a second embodiment of the present invention.

Now, an AFC apparatus according to a second embodiment of the present invention will be explained with reference to the accompanying drawings. FIG. 9 is a block diagram showing an AFC apparatus according to a second embodiment, in which component parts similar to those in FIGS. 1 and 7 are designated corresponding reference numerals as in FIGS. 1 and 7.

In FIG. 9, numeral 33 designates a key pulse input terminal, numeral 14 an input terminal for a key pulse amplified to a level sufficient to drive a TTL to drive D-latch circuits 20, 21, and numeral 18 an output terminal of a key pulse decision circuit which assumes a high impedance in the presence of a key pulse and vice versa.

Figure 5:
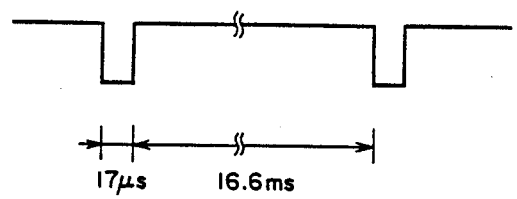
FIG. 5 shows a waveform of a keyed pulse used in a keyed AFC apparatus of a conventional satellite broadcasting receiver.
Figure 6:
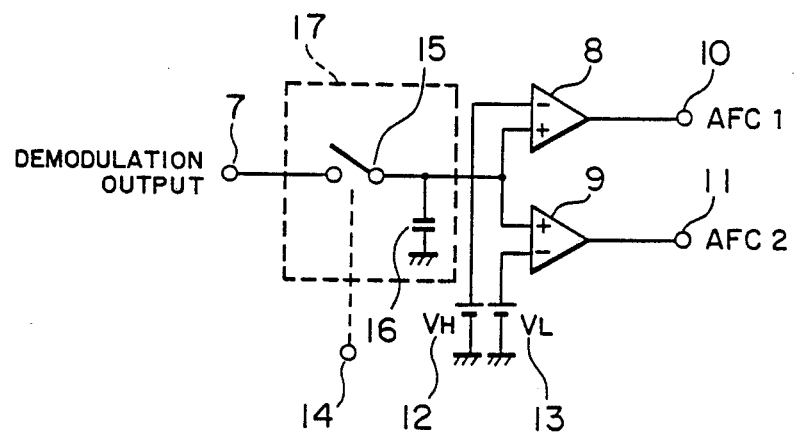
FIG. 6 is a block diagram showing a frequency error detector for a keyed AFC apparatus of a conventional satellite broadcasting receiver.

A pulse amplifier circuit including transistors 32, 47, 48, 49, resistors 34, 35, 37, 38, 40, 41, 43, 44, 46 and capacitors 42, 45 is supplied with a key pulse shown in FIG. 5 and produces a key pulse decision signal B and a key pulse signal A of TTL level.

When a key pulse is applied to the input terminal 33, the transistor 32 is turned off with the output terminal 18 at high impedance. A low pass filter is comprised of the resistor 30 and the capacitor 16. Under this condition, the time constant of the filter is required to be set smaller than the pulse duration of the key pulse (which is determined at 17 $\mu$s in the MUSE system, for example) to enable the output signal of the FM demodulator 3 to respond sufficiently against the key pulse duration. The low pass filter thus has the effect of removing high frequency noise contained in the demodulation output. As a result, the noise prevention characteristics of the keyed AFC circuit are improved.

An output of the low pass filter is compared at the voltage comparator ICs 8 and 9 with reference voltages 12 ($V_H$) and 13 ($V_L$) respectively equivalent to critical values of a predetermined frequency error. The voltage comparator ICs 8 and 9 which are required to respond with sufficient rapidity as compared with the duration of a key pulse should have a response speed of about 1 to 3 $\mu$s. This speed is realizable with general-purpose comparator ICs. The voltage comparator IC 8 is adapted to produce an output when the intermediate frequency deviates upward of the central frequency (say, 402.78 MHz) by more than a predetermined frequency error (say, 300 kHz). The voltage comparator IC 9, on the other hand, produces an output when the intermediate frequency deviates downward of the central frequency by more than a predetermined frequency error. Outputs of the voltage comparators ICs 8 and 9 are applied to the data input terminals of the D-latch circuits 20 and 21 respectively, and a key pulse is applied to a clock input terminal of each of the D-latch circuits 20 and 21, so that the logic value of the data input terminals is applied and held each time of application of a key pulse.

Outputs of the D-latch circuits 20 and 21 are applied to LPF 23 and LPF 24 respectively. The LPF 23 and LPF function as a noise-removing integration circuit in case the receiving CN ratio is reduced with an increased noise in the demodulation output and outputs of the voltage comparators 8 and 9 are produced by error from normal data. The time constant of the LpFs 23 and 24 should be selected at about 0.3 to one second fitting the AFC operation like in the first embodiment. The outputs AFC1 and AFC2 of the frequency error detector of the intermediate frequency against the central frequency thus obtained are such that by fine adjustment of the local oscillation frequency by a PLL frequency synthesizer, a keyed AFC is realized.

In the absence of a key pulse applied to the input terminal 33, on the other hand, the transistor 32 is on with the output terminal 18 at low impedance, and a low pass filter is made up of the resistor 30 and the capacitors 16, 31. Under this condition, the time constant of the filter is sufficiently large, and by integrating the video signal providing an output signal of the FM demodulator 3, an average-value DC voltage is produced. This voltage is compared at the voltage comparator ICs 8 and 9 with reference voltages 12 ($V_H$) and 13 ($V_L$) equivalent to critical values of a predetermined frequency error. Outputs thus compared are applied to the D-latch circuits 20 and 21 respectively. In the absence of a key pulse, the D-latch circuits 20 and 21 are always enabled, and therefore voltage-compared outputs are produced from the D-latch circuits 20 and 21 respectively. In the case under consideration, an average DC voltage value of a demodulation output signal corresponding to the average frequency of a modulation signal is compared with a reference voltage. If the local oscillation frequency is finely adjusted by a PLL frequency synthesizer by use of these compared outputs, an average-value AFC is realized.

It will thus be understood from the foregoing description that according to the present invention, the presence or absence of a key pulse is decided by switching the cut-off frequency of a low-pass filter for smoothing a FM demodulation output and by applying at the same time a key pulse to a clock terminal of a D-latch circuit, and in this way the two systems including the keyed AFC and the average-value AFC are switched automatically, thereby greatly contributing to practical effects.

I claim:

1. An AFC apparatus comprising an FM demodulator, a low-pass filter connected to the output of said demodulator and having a cut-off frequency capable of being switched to control a time constant thereof, a first comparator supplied with a first reference voltage and with an output of said FM demodulator through said low-pass filter for comparison with said first reference voltage, a second comparator supplied with a second reference voltage and with said output of said FM demodulator through said low-pass filter for comparison with said second reference voltage, a first latch circuit for holding a comparison output of said first comparator in response to a key pulse, a second latch circuit for holding a comparison output of said second comparator in response to said key pulse, oscillator means controlled by the outputs of said latch circuits, and a decision circuit for determining the presence or absence of an applied key pulse, said decision circuit controlling the time constant of said low-pass filter by reducing the cut-off frequency of said low-pass filter in the absence of an applied key pulse to smooth an AC component of an output signal of said demodulator, thereby selecting an average value AFC system mode, and increasing the cut-off frequency of said low-pass filter in the presence of an applied key pulse to set a time constant smaller than the key pulse duration, thereby selecting a keyed AFC system mode.

2. An AFC apparatus according to claim 1, wherein said decision circuit reduces the cut-off frequency of said low-pass filter in the absence of an applied key pulse to smooth an AC component of an output signal of said FM demodulator and to take out a DC component thereof and apply it to said first and second comparators, and said decision circuit increases the cut-off frequency of said low-pass filter in the presence of an applied key pulse to smooth the noise component only contained in an output signal of said FM demodulator by setting the output of said low-pass filter to a time constant smaller than the key pulse period, said oscillator means being a PLL frequency synthesizer circuit including a voltage controlled oscillator and said decision circuit producing a fine adjustment in the local oscillation frequency of said PLL frequency synthesizer circuit with the output signal of said first latch circuit and that of said second latch circuit, during a period other than a key pulse period.

* * * * *